United States Patent [19]
Zertani et al.

[11] Patent Number: 5,124,559
[45] Date of Patent: Jun. 23, 1992

[54] AFTERTREATMENT APPARATUS FOR PRINTING PLATES

[75] Inventors: Rudolf Zertani, Mainz; Friedrich Luellau, Bardowick; Rolf Leullau, Lueneburg, all of Fed. Rep. of Germany

[73] Assignee: Hoechst Aktiengesellschaft, Frankfurt am Main, Fed. Rep. of Germany

[21] Appl. No.: 678,439

[22] Filed: Apr. 1, 1991

[30] Foreign Application Priority Data

Apr. 5, 1990 [DE] Fed. Rep. of Germany ....... 4011023

[51] Int. Cl.⁵ .............................................. A61N 5/08
[52] U.S. Cl. .............................. 250/492.1; 250/504 R; 34/4
[58] Field of Search ............... 250/492.1, 492.2 R, 250/504 R; 34/4

[56] References Cited

U.S. PATENT DOCUMENTS

| | | | |
|---|---|---|---|
| 3,144,331 | 8/1964 | Thommes | 96/27 |
| 3,374,531 | 3/1968 | Bruce | 250/492.1 |
| 4,221,987 | 12/1983 | Herald | 250/504 R |
| 4,276,479 | 6/1981 | Mibu et al. | 250/492.1 |
| 4,298,005 | 11/1981 | Mutzhas | 250/504 R |
| 4,298,803 | 11/1981 | Matsuura et al. | 250/492.2 |
| 4,444,190 | 4/1984 | Mutzhas | 250/504 R |
| 4,665,627 | 5/1987 | Wilde et al. | 34/4 |
| 4,716,097 | 12/1987 | Weed | 430/327 |

FOREIGN PATENT DOCUMENTS 1214085 10/1966 Fed. Rep. of Germany .
2412571 11/1974 Fed. Rep. of Germany .

Primary Examiner—Jack I. Berman
Assistant Examiner—Kiet T. Nguyen
Attorney, Agent, or Firm—Foley & Lardner

[57] ABSTRACT

An aftertreatment apparatus, for printing plates which have been exposed imagewise comprises an exposure station and a heat station which are disposed one behind the other in the direction of conveyance of the printing plates along a conveyor track through the aftertreatment apparatus. The exposure station contains a regulable radiation source for the total area exposure of the printing plates. The housing of the exposure station has an exposure aperture 13 which faces downwardly and which is covered by a filter disc. The housing of the heat station is thermally insulated at three sides and is open downwards in the direction of a reflector table across which the printing plates are fed.

17 Claims, 2 Drawing Sheets

AFTERTREATMENT APPARATUS FOR PRINTING PLATES

BACKGROUND OF THE INVENTION

The invention relates to an aftertreatment apparatus, incorporating a heat station, for printing plates which have been exposed imagewise through an original.

To restore the sensitivity of photopolymerizable copying materials which have been deposited as a photosensitive layer on a printing plate substrate and whose sensitivity has decreased through absorption of molecular oxygen, it is known from DE-B 1,214,085 (U.S. Pat. No. 3,144,331) to expose the photosensitive layer by means of 70 to 98% of the radiation quantity of an actinic radiation which would be necessary to initiate photopolymerization with uniform incidence. The exposure is carried out through, for example, the transparent printing plate substrate, with an actinic radiation being used which has a wavelength such that only 10 to 70% of the radiation is absorbed by the photopolymerizable layer. In this process, exposure is carried out once diffusely and once imagewise. The diffuse or pre-exposure is carried out with a lower intensity, namely with 70 to 98% of the radiation intensity which is necessary to achieve the complete exposure action. This pre-exposure is then followed by the imagewise exposure through an original: employing the full radiation intensity.

U.S. Pat. No. 4,298,803 discloses a process in which a photoresist layer is pre-exposed with an intensity which is lower than the critical exposure intensity at which the photoresist is completely decomposed at a particular point. After this pre-exposure, the photoresist layer is exposed imagewise. The sequence of the pre-exposure and the exposure through an original can be interchanged. In both cases, the sensitivity of the photoresist layer is improved, thereby shortening processing time considerably. In the equipment used for this process, both the imagewise exposure and the pre-exposure or after-exposure of the photoresist can be carried out by means of an electron beam, or a UV or X-ray radiation source.

U.S. Pat. No. 4,716,097 likewise discloses a process in which a photopolymeric layer which contains a dyestuff is first exposed diffusely by means of light of a wavelength above 400 nm and an intensity of at least 1,500 lumen/m², and then exposed imagewise.

German Offenlegungsschrift DE-A 2,412,571 describes a process for curing a photocurable polymer layer of a printing plate, in which process exposure is first carried out diffusely for a short time and then imagewise until the polymer layer is virtually completely cured in the exposed regions. The diffuse exposure time is not more than 90% of the time during which the complete curing of the polymer layer takes place at the same intensity of radiation both for the pre-exposure and also for the imagewise exposure.

SUMMARY OF THE INVENTION

One object of the invention is to provide an improved aftertreatment apparatus for printing plates which have already been exposed imagewise. A further object is to provide an improved after-treatment apparatus wherein the image areas of the printing plates are additionally cured without the non-image areas of the printing plates being incipiently crosslinked.

In accomplishing the foregoing objects, there has been provided according to the invention an aftertreatment apparatus for printing plates which have been exposed imagewise, comprising a reflector table for receiving the printing plates on a top surface thereof; a heat station comprising a housing having insulated top and opposing side walls, the housing having an opening facing downward toward the reflector table; an IR radiation source disposed within the housing; an exposure station positioned adjacent to the heat station and having top and opposing side walls, the exposure station having an exposure aperture present in the lower surface thereof; a regulable radiation source disposed within the top wall of the exposure station; and a filter disc covering the exposure station. Additionally provided are means for regulating the radiation source, and means for conveying the printing plates on the reflector table through the aftertreatment apparatus.

Other objects, features and advantages of the present invention will become apparent to those skilled in the art from the following detailed description. It should be understood, however, that the detailed description and specific examples, while indicating preferred embodiments of the present invention, are given by way of illustration and not limitation. Many changes and modifications within the scope of the present invention may be made without departing from the spirit thereof, and the invention includes all such modifications.

DETAILED DESCRIPTION OF THE PREFERRED EMBODIMENTS

The aftertreatment apparatus according to the invention is used to process photopolymer printing plates, in particular, projection plates and highly photosensitive laser plates. As a result of the aftertreatment, it is possible with the use of light of very low intensity and of afterheating, to increase the service life or the print run of printing plates substantially. For this purpose, the printing plates which have been exposed image-wise and which have been exposed, for example, in a laser exposure apparatus with a wavelength of 488 nm or have received a projection exposure due to a mercury or xenon radiator, flash lamp, carbon lamp or the like, are subjected in the aftertreatment apparatus to a second total-area diffuse exposure with light of a wavelength $\lambda = 450$ nm to 650 nm having a very low intensity of approximately 100 to 800 lux x seconds and then afterheated to a temperature of 80° to 120° C, in the same apparatus. An advantage of this aftertreatment apparatus is that both the exposure station and the heat station can be regulated separately from each other.

This object is achieved, according to the invention, by an aftertreatment apparatus in which the heat station is preceded by an exposure station integrated in the aftertreatment apparatus. In addition the exposure station incorporates a regulable radiation source for total-area exposure of the printing plate and a filter disk which covers an exposure aperture at the underside of the exposure station, and the heat station is equipped with an IR radiation source in a housing which is provided at three sides with an insulation and which is open downwards towards a reflector table across which the printing plate is fed through the after-treatment apparatus.

In a development of the invention, the radiation source of the exposure station is a fluorescent lamp whose illumination intensity can be infinitely regulated between 30% and 100% of the maximum illumination intensity by means of an electronic dimmer. The spectral component of the fluorescent lamp is in the wavelength range from 400 to 700 nm and 80% of the emitted radiation has a wavelength greater than 500 nm.

In further developments of the invention, the exposure aperture is constructed as a slit whose width can be adjusted by means of an adjustment mechanism from 0.5 to 20 mm. The filter disk which covers the exposure aperture is composed of a plastic disk and a filter film bonded to said plastic disk, the filter film being transparent to radiation above the spectral range of 500 nm and virtually impermeable to radiation having a wavelength of less than or equal to 500 nm.

Further objects, features and advantages of the invention will become apparent from the detailed description of exemplary embodiments which follows when considered together with the drawings.

The invention is explained in greater detail below with reference to the drawings.

Figure 1:
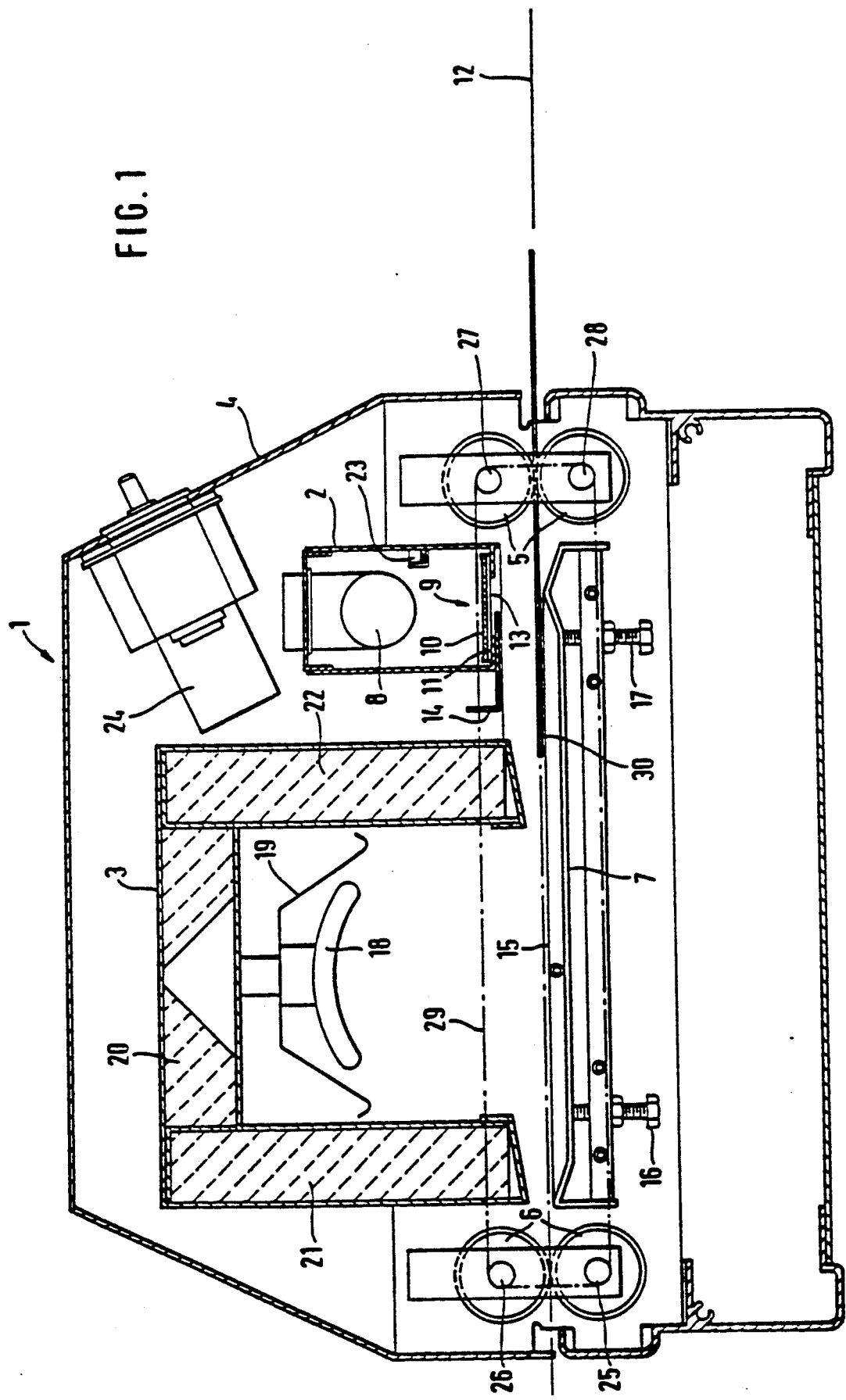
FIG. 1 shows a diagrammatic sectional view of the aftertreatment apparatus according to the invention.

More specifically, an aftertreatment apparatus shown diagrammatically in FIG. 1 comprises an exposure station 2, a heat station 3, a reflector table 7 and conveyor roller pairs 5 and 6, all of which units are enclosed by a housing 4 of the aftertreatment apparatus. Printing plates 30, one of which is shown diagrammatically in FIG. 1, travel along a conveyor track 12 through the aftertreatment apparatus 1. To convey the printing plate 30 through the aftertreatment apparatus, the intake conveyor roller pair 5 is present at the beginning of the conveyor track 12 inside the apparatus and the discharge conveyor roller pair 6 at the end of the conveyor track inside the apparatus. Seated on the shafts of the conveyor rollers of these two conveyor roller pairs are cylindrical gears 25, 26, 27 and 28 over which an endlessly circulating gear chain 29 is passed. One of the conveyor rollers of the intake roller pair 5 is driven by an electric motor which is not shown. The cylindrical gear of the driven conveyor roller sets the gear chain 29 in circulation, which ensures the synchronous running between the intake roller pair and the discharge roller pair.

The heat station 3 is preceded, viewed in the direction of conveyance of the printing plates, by the exposure station 2. Situated in the exposure station 2 is a regulable radiation source 8 for the total-area diffuse exposure of the printing plate 30. The radiation source 8 is, for example, a fluorescent lamp which is situated in a closed housing of the exposure station 2. At its lower end, i.e., in the direction of the conveyor track 12 for the printing plates, the housing of the exposure station 2 has an exposure aperture 13 which is covered by a filter disk 9. The exposure aperture 13 is constructed as an exposure slit whose width can be adjusted by an adjustment mechanism 14 in the range from 0.5 to 20 mm. The adjustment mechanism 14 is constructed as an angular slide which runs in rails.

The filter disk 9 is composed of a plastic disk 10 made, for example, of polymethyl methacrylate PMMA and a filter film 11 bonded thereto. The filter film 11 is so chosen that it is transparent to radiation above the spectral range of 500 nm and is virtually impermeable to radiation having a wavelength of less than or equal to 500 nm.

It is also possible to use filter disks 9 which are cutoff filters and are composed of a PMMA disk alone which is appropriately tinted, or a specially stained glass, supplied for example, by Messrs. Schott, Mainz, Germany.

The illumination intensity of the radiation source 8 of the exposure station 2 can be infinitely regulated electronically between 30% and 100% of the maximum illumination intensity with the aid of a dimmer for the purpose of precisely metering the quantity of light applied to the printing plate 30. The illumination intensity of this radiation source is indicated digitally, a sensor 23 being fitted in the interior of the housing of the exposure station 2 for the purpose of measuring the illumination intensity. The closed construction of the housing prevents the appearance of external interfering radiations which could impair the measurement of the illumination intensity by means of the sensor 23 in an undesirable manner.

The dimmer for adjusting the illumination intensity of the radiation source 8 is part of an electronic regulator 24 which is shown diagrammatically above the exposure station 2.

The spectral component of the radiation source 8 is in the wavelength range from 400 to 700 nm, 80% of the emitted radiation having a wavelength greater than 500 nm. The energy loss or the radiation absorption due to the filter disk 9 or the filter film 11 and, consequently also the heating of these components, is very small as a result of the chosen spectral distribution of the radiation source 8.

The sensor 23 for measuring the illumination intensity is normally a photocell which is situated in the housing of the exposure station 2 and consequently shielded from any interfering radiation such as, for example, daylight entering the aftertreatment apparatus 1.

The heat station 3 is equipped with an IR radiation source 18 which is accommodated in a housing which is thermally insulated at three sides with an insulation 20, 21, 22. Downwardly the housing is open onto the reflector table 7 across which the printing plate 30 is fed through the aftertreatment apparatus 1. The radiation source 18 of the heat station 3 is, for example, an infrared dark radiator made of ceramic which emits radiation in a wavelength range far away both from the visible wavelength range and from the radiation sensitivity range of the printing plates. Fitted above the IR radiation source 18 is a reflector 19. The radiation emitted by the IR radiation source 18 is in a wavelength range from 1,000 nm to over 10,000 nm. As a result of this spectral range of thermal radiation, it is possible to meter the electromagnetic radiations acting on the printing plates 30. Namely, on the one hand, the above-mentioned infrared radiation for producing heat and, on the other hand, the diffuse exposure with visible light for the purpose of the so called "after-exposure" of the printing plate already exposed imagewise.

The IR radiation source 18 can be regulated in its radiation power so that the printing plate 30 can be heated to a temperature of 80° to 120° C.

Figure 2:
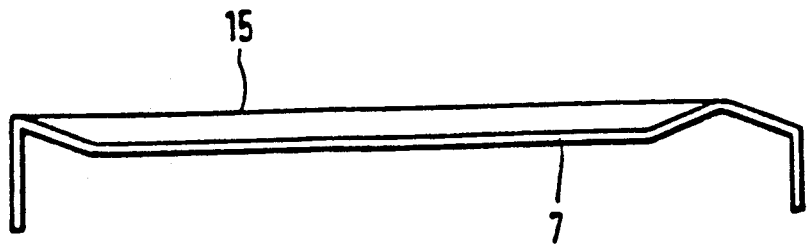
FIG. 2 shows a partial view of the reflector table of the aftertreatment apparatus in section.
Figure 3:
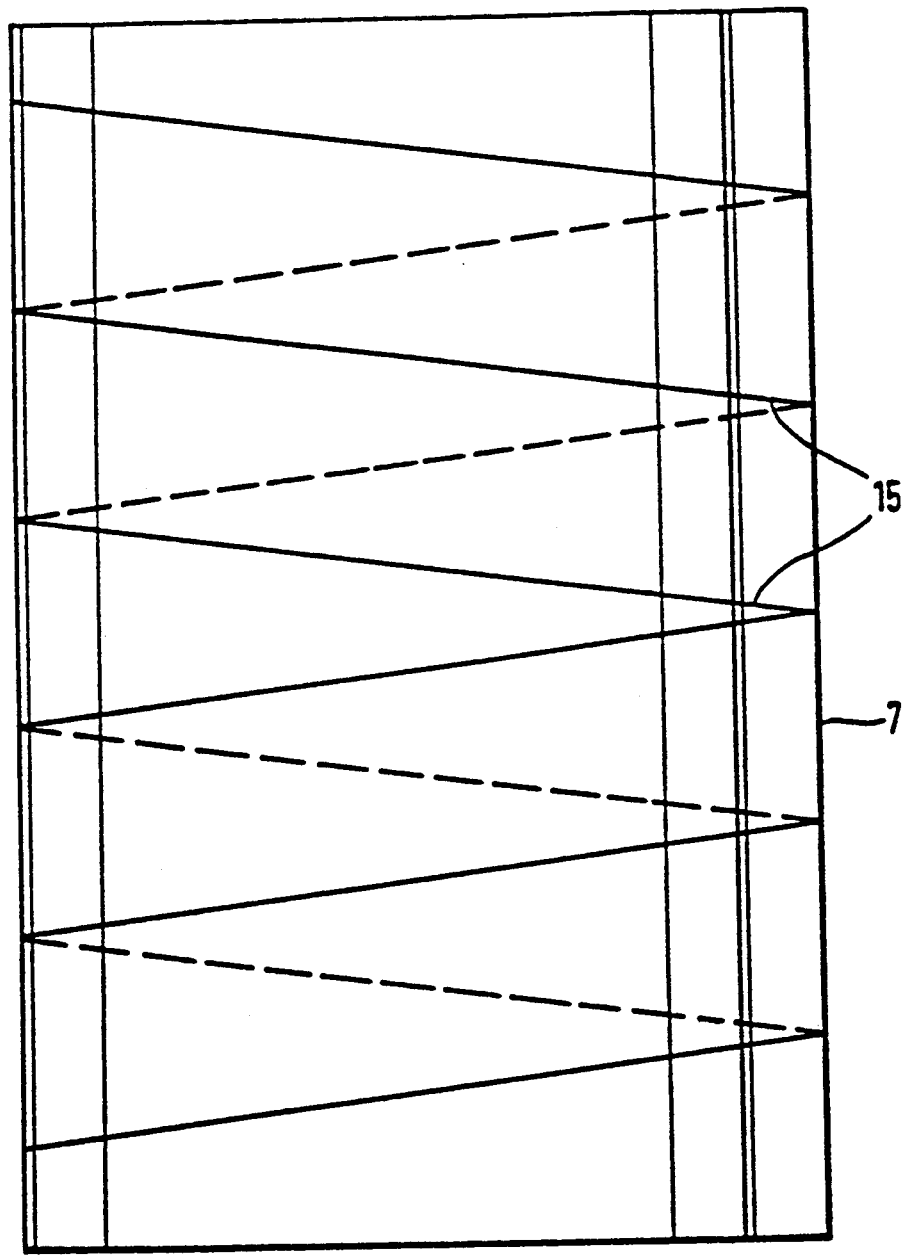
FIG. 3 shows a plan view of the reflector table according to FIG. 2.

As seen in FIGS. 2 and 3, the reflector table 7 is shaped as a trough-like hollow body which has stringing 15 at the level of the conveyor track 12 of the printing plates 30. The stringing 15 is composed either of a thin metal wire or a thin plastic thread and is stretched in a V-shaped manner on the upper side of the reflector table (cf. FIG. 3) so that the front corners of the printing plate cannot get under the stringing during conveyance through the aftertreatment apparatus thereby preventing a printing plate jam.

The very low heat capacity of the stringing 15 compared with the printing plate 30 prevents any heat drain which could lead to nonuniform heating of the printing plate at any point during the heating of the plate in the region beneath the heat station 3. The inside of the reflector table 7 is lined with a heat-reflecting metal sheet. Situated at the underside of the reflector table ar adjustment devices 16, 17, normally adjustment screws, for raising and lowering the base plane of the trough-like reflector table 7 within a small range in order to adjust the distance of the underside of the printing plate from the base plane of the reflector table.

Contact between the printing plate and the metal sheet of the reflector table should be avoided since this could lead to a heat drain from the printing plate. This would result in a partial lowering of temperature in the region of the contact area and therefore in a nonuniform heating and post-curing of the photopolymer layer of the printing plate.

Radiation source 8 of the exposure station 2 produces a very uniform exposure intensity over the working width of the printing plate 30. The electronic regulator 24 ensures a high service life of the radiation source 8 of the exposure station, and the exposure intensity of the radiation source can be infinitely controlled and is indicated digitally for the purpose of precisely controlling the exposure of the printing plate. The results are consequently always reproducible, even in the case of aging of the radiation source or variations in exposure intensity due to temperature variations or mains interferences. Further advantages of the aftertreatment apparatus are that no interfering radiations can appear in the region of the exposure station and of the heat station, undesirable UV components in the spectrum of the radiation source of the exposure station are filtered out by special filter films or cutoff filters made of glass or PMMA and that the exposure aperture can be adjusted for the exposure in a range of 0.5 to 20 mm.

What is claimed is:

1. An after treatment apparatus for treating printing plates which have been exposed imagewise through an original, said apparatus comprising:
   a reflector table for receiving said printing plates on a top surface thereof;
   a heat station comprising a housing having insulated top and opposing side walls, said housing having an opening which faces downwardly toward said reflector table;
   an IR radiation source disposed within said housing;
   an exposure station positioned adjacent said heat station and having top and opposing side walls, said exposure station having an exposure aperture formed in a lower surface thereof, said exposure aperture comprising a slit having a width which is adjustable from 0.5mm to 20mm;
   a regulable radiation source disposed within said top wall of said exposure station;
   a filter disc covering said exposure aperture; and
   an adjustment mechanism which adjusts the width of said slit.

2. The aftertreatment apparatus as claimed in claim 1, wherein said regulable radiation source comprises a fluorescent lamp having an illumination intensity which is infinitely regulable between 30% and 100% of a maximum illumination intensity, and further comprising an electronic dimmer for regulating the illumination intensity of said fluorescent lamp.

3. The aftertreatment apparatus as claimed in claim 2, wherein the spectral component of said fluorescent lamp is in the wavelength range from 400 to 700 nm and wherein 80% of an emitted radiation of said fluorescent lamp has a wavelength greater than 500 nm.

4. The aftertreatment apparatus as claimed in claim 1, wherein said filter disc comprises a plastic disc and a filter film bonded to said plastic disc and wherein the filter film is transparent to radiation above the spectral range of 500 nm and is virtually impermeable to radiation having a wavelength of less than or equal to 500 nm.

5. The aftertreatment apparatus as claimed in claim 1, wherein the filter disc comprises one of a cutoff filter made of specially stained glass or stained polymethyl methacrylate PMMA.

6. The aftertreatment apparatus as claimed in claim 1, further comprising a sensor which is disposed in the interior of said housing of said exposure station, which measures the illumination intensity of the regulable radiation source, and which provides a digital reading of the illumination intensity of said regulable radiation source.

7. The aftertreatment apparatus as claimed in claim 1, wherein said IR radiation source comprises an infrared dark radiator made of ceramic which emits radiation in a wavelength range far away from both the visible wavelength range and from a radiation sensitivity range of said printing plates.

8. The aftertreatment apparatus as claimed in claim 7, wherein said IR radiation source emits radiation in a wavelength range from 1,000 to 10,000 nm.

9. The aftertreatment apparatus as claimed in claim 8, wherein said IR radiation source is regulable in its radiation power so that the printing plate can be heated to a temperature of 80° C. to 120° C.

10. The aftertreatment apparatus as claimed in claim 1, further comprising a conveyor track for transporting said printing plates into and out of said aftertreatment apparatus, and wherein said reflector table comprises a trough-like hollow body, which body comprises a stringing located at the level of said conveyor track.

11. The aftertreatment apparatus as claimed in claim 10, wherein said stringing comprises one of a thin metal wire and a thin plastic thread and is stretched in a V-shaped manner on said surface of said reflector table.

12. The aftertreatment apparatus as claimed in claim 1, further comprising a heat-reflecting metal sheet which lines an inside of said reflector table.

13. The aftertreatment apparatus as claimed in claim 12, further comprising
   a motor,
   a conveyor track,
   a pair of intake conveyor rollers and a pair of discharge conveyor rollers which are rotatably mounted on shafts and which convey said printing plates along said conveyor track through the aftertreatment apparatus,
   an endlessly circulating gear chain, and
   cylinder gears over which said endlessly circulating gear chain passes, said cylinder gears being seated on said shafts of said conveyor rollers, with one of said conveyor rollers being driven by said motor, said roller pairs being situated in the interior of said aftertreatment apparatus and being synchronously driven by said endlessly circulating gear chain.

14. An aftertreatment apparatus for treating printing plates which have been imagewise exposed through an original, comprising:
 a reflector table for receiving said printing plates on a top surface thereof;
 a heat station comprising a housing having insulated top and opposing side walls, said housing having an opening which faces toward said reflector table;
 an IR radiation source disposed within said housing;
 an exposure station positioned adjacent said heat station and having a top wall and opposing side walls, said exposure station having a top wall and opposing side walls, said exposure station having an exposure aperture formed therein, said exposure aperture comprising a slit having a width which is adjustable from 0.5mm to 20mm;
 a regulable radiation source disposed within said top wall of said exposure station;
 a filter disc covering said exposure aperture;
 means for regulating said regulable radiation source;
 means for conveying said printing plates on said reflector table into and out of said aftertreatment apparatus; and
 an adjustment mechanism which adjusts the width of said slit.

15. The aftertreatment apparatus as claimed in claim 14, wherein said filter disc comprises a plastic disc and a filter film bonded to said plastic disc and wherein the filter film is transparent to radiation above the spectral range of 500 nm and is virtually impermeable to radiation having a wavelength of less than or equal to 500 nm.

16. The aftertreatment apparatus as claimed in claim 14, further comprising a motor and a conveyor track, and wherein said conveying means comprises
 a pair of intake conveyor rollers and a pair of discharge conveyor rollers which are rotatably mounted on shafts and which convey said printing plates along said conveyor track through the aftertreatment apparatus,
 an endlessly circulating gear chain, and
 cylinder gears over which said endlessly circulating gear chain passes, said cylinder gears being seated on said shafts of said conveyor rollers, with one of said conveyor rollers being driven by said motor, said roller pairs being situated in the interior of the housing and being synchronously driven by said endlessly circulating gear chain.

17. An aftertreatment apparatus as claimed in claim 14, wherein said regulating means comprises a dimmer connected to said regulable radiation source.

* * * * *